United States Patent
Hagiwara et al.

(10) Patent No.: US 6,365,443 B1
(45) Date of Patent: Apr. 2, 2002

(54) METHOD OF MANUFACTURING A SEMICONDUCTOR DEVICE HAVING DATA PADS FORMED IN SCRIBED AREA

(75) Inventors: Shingo Hagiwara; Amane Inoue; Eiichi Nagai; Masaji Inami; Tohru Takeshima; Kouichi Noro; Hideaki Suzuki, all of Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/538,231

(22) Filed: Mar. 30, 2000

(30) Foreign Application Priority Data

Aug. 26, 1999 (JP) .......................... 11-240227
Feb. 16, 2000 (JP) ...................... 2000-038777

(51) Int. Cl.[7] .................. H01L 21/82; H01L 21/44; H01L 21/301
(52) U.S. Cl. .................. 438/130; 438/110; 438/462
(58) Field of Search ............... 438/132, 467, 438/601, 130, 129, 128, 110, 460, 462, 465, 113

(56) References Cited

U.S. PATENT DOCUMENTS

| | | | | |
|---|---|---|---|---|
| 4,446,475 A | * | 5/1984 | Gercekci et al. | 257/48 |
| 4,845,351 A | * | 7/1989 | Hara et al. | 235/492 |
| 5,059,899 A | * | 10/1991 | Farnworth et al. | 438/18 |
| 5,444,366 A | * | 8/1995 | Chiu | 324/158.1 |
| 5,477,062 A | * | 12/1995 | Natsume | 257/48 |
| 5,654,582 A | * | 8/1997 | Kijima et al. | 257/620 |
| 5,739,546 A | * | 4/1998 | Saitou et al. | 257/48 |
| 5,981,971 A | * | 11/1999 | Miyakawa | 257/48 |
| 6,153,450 A | * | 11/2000 | Deguchi | 438/130 |

FOREIGN PATENT DOCUMENTS

| | | |
|---|---|---|
| JP | 59-172243 | 9/1984 |
| JP | 61-87349 | 5/1986 |
| JP | 62-74696 | 4/1987 |
| JP | 10-256324 | 9/1998 |

* cited by examiner

Primary Examiner—Matthew Smith
Assistant Examiner—Lex H. Malsawma
(74) Attorney, Agent, or Firm—Armstrong, Westerman & Hattori, LLP

(57) ABSTRACT

On a semiconductor wafer, there are formed chip areas for storing memory areas, scribe areas for cutting the semiconductor wafer, pads for supplying electric signals from the outside in order to write data into the memory areas, and lead wires for electrically connecting the pads with the memory areas. The pads are formed within the scribe areas. After data has been written into the memory areas through the pads, the semiconductor wafer is cut along the scribe areas, thereby obtaining semiconductor chips. At the time of this cutting, the pads or the lead wires are cut.

11 Claims, 21 Drawing Sheets

METHOD OF MANUFACTURING A SEMICONDUCTOR DEVICE HAVING DATA PADS FORMED IN SCRIBED AREA

FIELD OF THE INVENTION

The present invention relates to a method of manufacturing a semiconductor device. More particularly this invention relates to a method of manufacturing a semiconductor device such as IC (integrated circuit) chips used for IC cards.

BACKGROUND OF THE INVENTION

It has been expected in the future that there will be a wide distribution of IC cards such as railway ticket cards and electronic money cards in the field of electronic commerce. The IC cards are mounted with IC chips that store various kinds of information. The IC chips are generally constructed of nonvolatile memories, such as, for example, ferroelectric memories (FeRAM).

Information about fare and a section of a railway a person travels, etc. are stored in the IC chips used as the railway ticket card. Information about a password, amount, a bank account number, a credit number, etc. is stored in IC chips used as the electronic money card. It is important that these information must not be made known to other persons, and that the information regarding money can not be rewritten by a third party.

In general, a plurality of square chip areas, each chip area having a size of the order of a few millimeters on one side, are formed on a semiconductor wafer. The IC chips are then manufactured by cutting and separating these chip areas. FIG. 1 is a top plan view schematically illustrating an enlarged main portion of a prior-art semiconductor wafer. A plurality of chip areas 11 are formed on a semiconductor wafer 1.

Although not shown, circuit elements like transistors are formed in each chip area 11. A plurality of pads 12 are also formed within each chip area 11. The pads 12 are electrically connected to various circuit elements with wires 13. Four pads 12 are illustrated in this figure. However, in general, several to a hundred and dozens of pads 12 are present in one wafer.

A scribe area 14 is formed between the chip areas 11. The wafer 1 is cut along the scribe areas 14 using a diamond cutter or using laser beams at the time of dicing. Individual IC chips are obtained by such cutting.

In order to use these IC chips in the IC cards, it is necessary to write various information in a memory area within each chip before dicing, that is, when the IC chips are in the form of a wafer. As this information is extremely secret, it is necessary to provide various measures to prevent the information from being leaked to other persons or from being corrupted. Therefore, the technique of encryption or the like is utilized so as to prevent the written information from being easily stolen.

When the conventional IC chips having a structure as shown in FIG. 1 are to be used directly for IC cards, various pieces of secret information are written into the IC chips through the pads 12 before dicing. Accordingly, when IC cards mounted with the IC chips are handed over to users after dicing, there is a risk that the information written on the IC cards is read out through the pads 12 that remain in the chip areas 11. Further, if a person succeeds in decoding the read out information, then he can easily corrupt the written information through the remaining pads 12.

SUMMARY OF THE INVENTION

It is an object of the present invention to provide a method of manufacturing a semiconductor device capable of preventing highly secret information written in the semiconductor device before dicing from being read out or corrupted after dicing.

In order to achieve the above object, according to the present invention, on a semiconductor wafer, there are formed chip areas for storing memory areas, scribe areas for disconnecting the semiconductor wafer, pads for being supplied with electric signals from the outside for writing data into the memory areas, and lead wires for electrically connecting the pads with the memory areas. In this case, the pads are formed within the scribe areas. After data has been written into the memory areas through the pads, the semiconductor wafer is cut along the scribe areas, thereby obtaining semiconductor chips (IC chips).

According to the present invention, prior to the cutting of the semiconductor wafer, data is written into the memory areas within the chip areas by supplying electric signals to the pads formed in the scribe areas. The pads are cut together with the scribe areas at the time of dicing. Therefore, after the semiconductor wafer has been cut and semiconductor chips are obtained, it is possible to prevent the written data from being read out from the memory areas of the semiconductor chips and to prevent corruption of the written data.

The pads and the lead wires may be formed on the same metal wired layer. Alternatively, the pads and the lead wires may be formed on different wired layers, and they are electrically connected together through contact sections. Alternatively, in the present invention, the lead wires may be formed on a plurality of divided wired layers, and the lead wires are electrically connected with the pads through contact sections.

Further, after the data has been written into the memory areas within the chip areas, and before carrying out dicing, the pads in the scribe areas may be removed based on a photolithographic technique and by etching.

Based on the above-described arrangement, it is possible to prevent a part of each pad from remaining in each semiconductor chip after dicing when the width of the cut area in which semiconductor chips are actually obtained by dicing is smaller than the width of each pad. Accordingly, after the semiconductor wafer has been cut and the semiconductor chips are obtained, it is possible to prevent more securely the written data from being read out from the memory areas of the semiconductor chips and to prevent corruption of the written data.

Further, after the data has been written into the memory areas within the chip areas, the lead wires within the chip areas may be cut before dicing.

With the above-described arrangement, even if a part of the pad remains in the semiconductor chip after dicing, it is possible to isolate this pad from the inside memory area. Accordingly, after the semiconductor wafer has been disconnected to obtain the semiconductor chips, it is possible to prevent more securely the written data from being read out from the memory areas of the semiconductor chips and to prevent corruption of the written data.

As a method of cutting each lead wire, it may be so arranged that a fuse window is provided on a part of the lead wire in advance, and laser beams are irradiated onto this fuse window.

As an alternative method of cutting each lead wire, it may be so arranged that a field-effect transistor is formed in the middle of the lead wire in advance, and a high voltage is applied to a gate of this transistor thereby destroying the transistor.

With the above-described arrangement, even if a part of the pad remains in the semiconductor chip after dicing, it is possible to isolate this pad from the inside memory area. Accordingly, it is possible to prevent more securely the written data from being read out from the memory areas of the semiconductor chips and to prevent corruption of the written data.

As an alternative method of cutting each lead wire, it may be so arranged that two field-effect transistors are formed in series connection in the middle of the lead wire in advance, and one transistor is destroyed in a state that the other transistor closer to the memory area within the chip area has been turned off.

With the above-described arrangement, it is possible to prevent more securely the written data from being read out from the semiconductor chip after dicing and to prevent corruption of the written data. Further, it is also possible to prevent the memory area from being affected by the breaking of the transistor.

In the present invention, each lead wire may be connected to a pad within a cut area in which semiconductor chips are actually obtained at the time of dicing, or each lead wire may be arranged beyond the cut area.

With the above-described arrangement, the lead wire is cut in the middle. Therefore, even if a part of the pad remains in the semiconductor chip after dicing, it is possible to isolate this pad from the inside memory area. Accordingly, it is possible to prevent more securely the written data from being read out from the memory areas of the semiconductor chips and to prevent corruption of the written data.

Further, in the present invention, pads within each chip area may be formed within a scribe area sandwiched by two adjacent chip areas such that the pads extend beyond a cut area in which semiconductor chips are actually obtained by dicing.

Based on the above-described arrangement, even if a part of the pad remains in a semiconductor chip after dicing, this pad was originally formed in another semiconductor chip. Therefore, it is possible to isolate this pad from the inside memory area. Accordingly, it is possible to prevent more securely the written data from being read out from the memory areas of the semiconductor chips and to prevent corruption of the written data.

In the present invention, a plurality of pads may be formed in each chip area, and the lead wires of the respective pads are disposed in a mutually insulated state by crossing together in complex through a plurality of wired layers.

With the above-described arrangement, after the semiconductor chip has been cut from the semiconductor wafer, it is difficult to understand the wired routes of the lead wires when a semiconductor chip is observed from the above. Therefore, even if a part of the pad remains in a semiconductor chip after dicing, it is not possible to read the write data from the memory area of the semiconductor chip through any one of the pads. Accordingly, it is possible to prevent more securely the written data from being read out from the memory areas of the semiconductor chips and to prevent corruption of the written data.

Alternatively, in the present invention, the lead wires connected to the pads may be drawn out into the scribe area, and the lead wires may be separated from the pads in this scribe area. In this case, it may also be so structured that the lead wires within the scribe area are returned within the cut area in which semiconductor chips are actually obtained when the semiconductor wafer is cut so that the returned lead wires are connected to the pads formed within the original chip area. Further, alternatively, it may be so structured that the lead wires are connected to the pads formed in another chip area, for example, in an adjacent chip area, beyond the scribe area.

Based on the above-described arrangement, a part of the lead wires is disconnected together with the scribe area at the time of dicing, so that the lead wires are separated from the pads. In other words, it is possible to electrically isolate the lead wires from the pads. Accordingly, after the semiconductor wafer has been cut and individual semiconductor chips are obtained, it is possible to prevent the written data from being read out from the memory areas of the semiconductor chips and to prevent corruption of the written data.

Other objects and features of this invention will become apparent from the following description with reference to the accompanying drawings.

DESCRIPTION OF THE PREFERRED EMBODIMENTS

Embodiments of a method of manufacturing a semiconductor device relating to the present invention will be explained in detail with reference to drawings.

Figure 1:
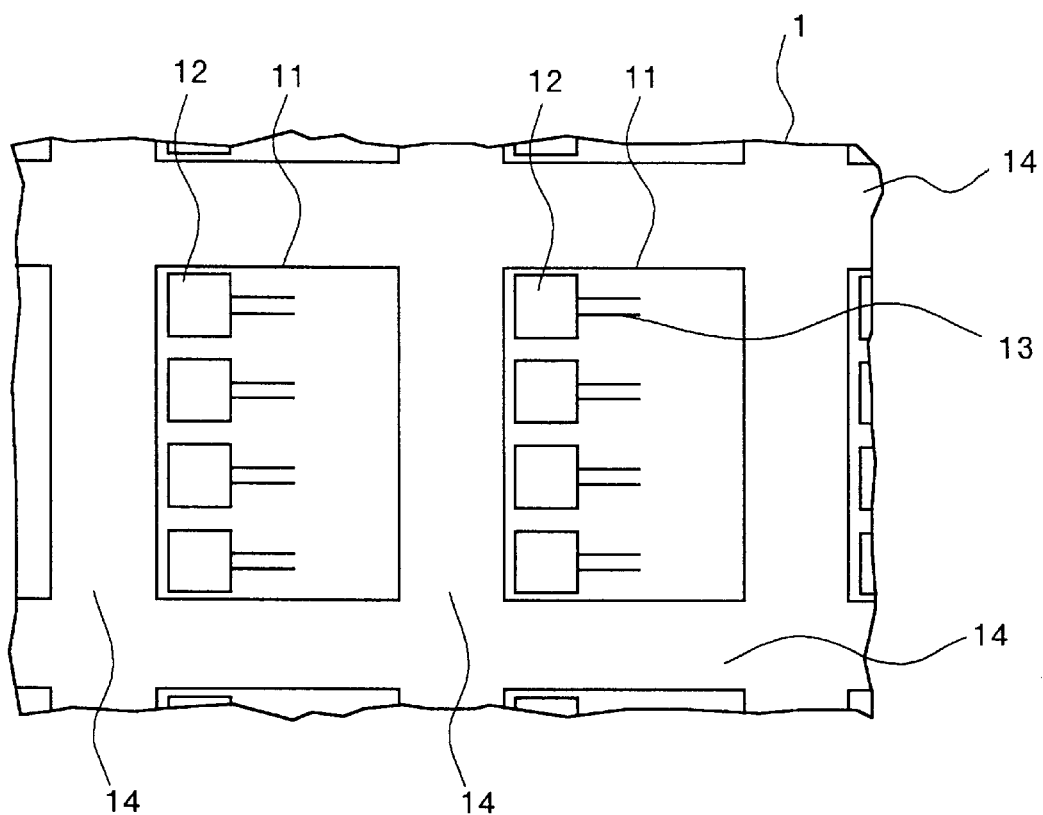
FIG. 1 is a top plan view schematically illustrating an enlarged main portion of a prior-art semiconductor wafer.
Figure 2:
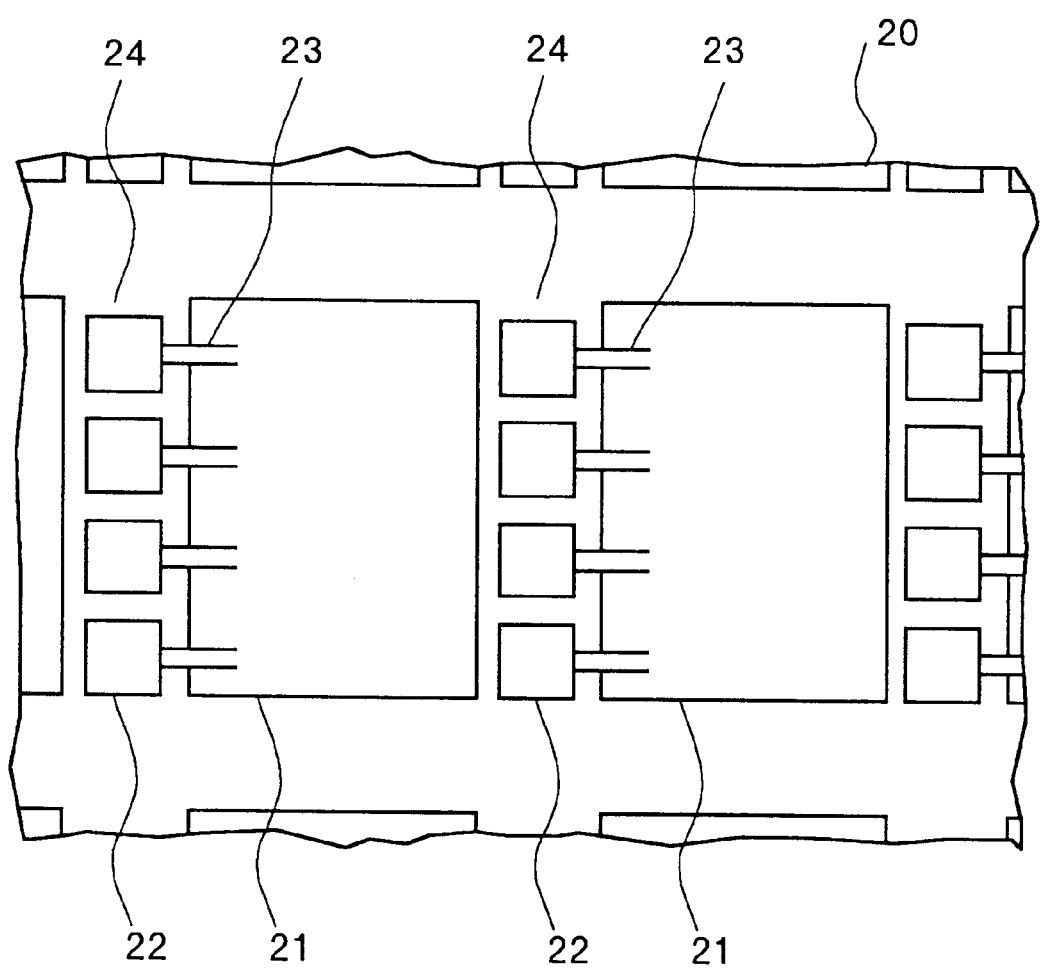
FIG. 2 is a top plan view schematically illustrating an enlarged main portion of a semiconductor wafer manufactured by a method of the first embodiment of the present invention.
Figure 3:
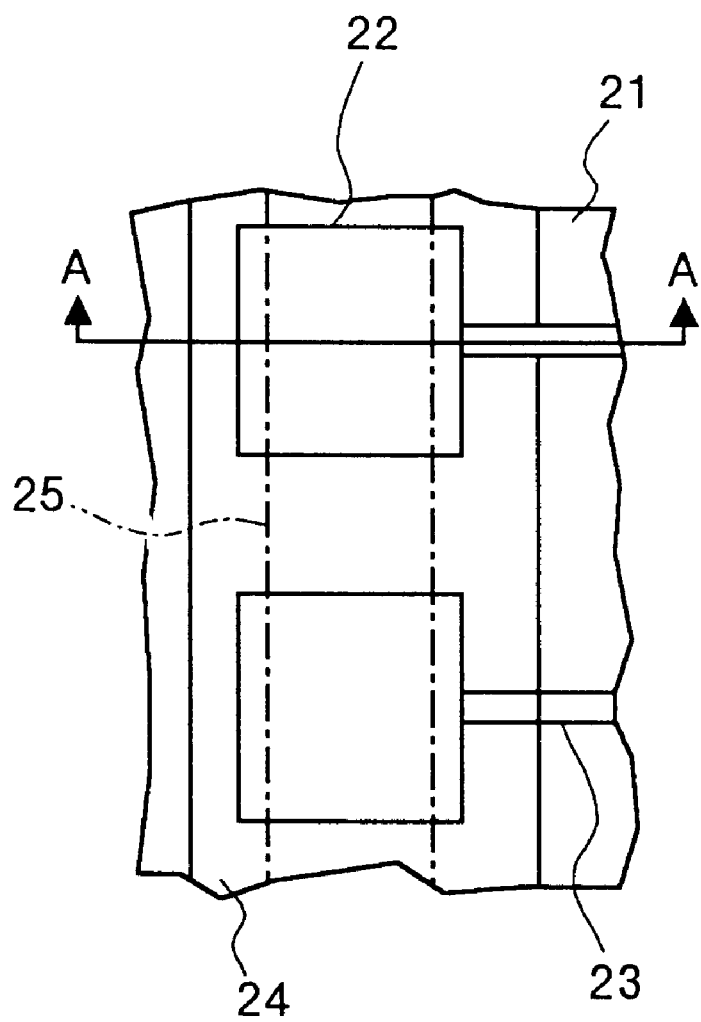
FIG. 3 is a top plan view schematically illustrating an enlarged part of a scribe area of the semiconductor wafer shown in FIG. 2.
Figure 4A:
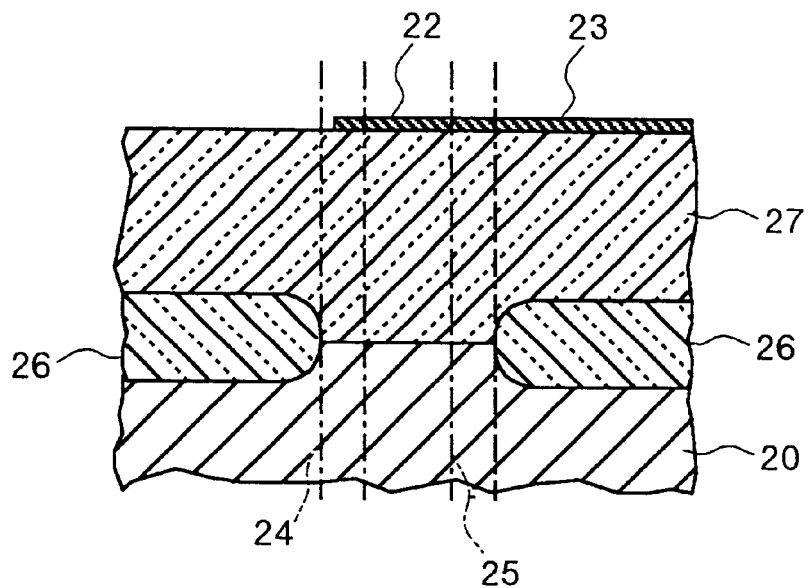
FIG. 4A and FIG. 4B are vertical cross-sectional views of a portion cut along a line A—A of the semiconductor wafer shown in FIG. 3.
Figure 4B:
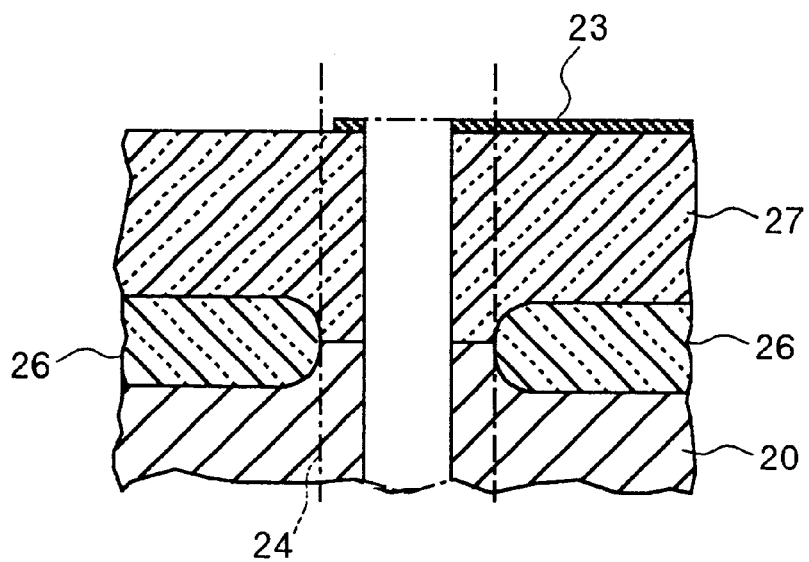

FIG. 2 is a top plan view schematically illustrating an enlarged main portion of a semiconductor wafer manufactured using the method of a first embodiment of the present invention. FIG. 3 is a top plan view schematically illustrating an enlarged part of a scribe area of the semiconductor wafer shown in FIG. 2. FIG. 4A and FIG. 4B are vertical cross-sectional views of a portion cut along a line A—A of the semiconductor wafer shown in FIG. 3. FIG. 4A shows a state before dicing, and FIG. 4B shows a state after dicing.

As shown in FIG. 2, a plurality of chip areas 21 are formed on a semiconductor wafer 20. In each chip area 21, there are formed circuit elements like transistors not shown. A memory area is constructed of the circuit elements. This memory area is used for storing encrypted secret information or the like.

A scribe area 24 is formed between adjacent chip areas 21. A plurality of pads 22 are formed in each scribe area 24. The pads 22 are used to supply electric signals from the outside at the time of writing information into the memory areas within the chip areas 21. In other words, the pads 22 are electrically connected to the circuit elements in the memory areas through lead wires 23. Four pads 22 are illustrated in this figure. However, in general, several to a hundred and dozens of pads 22 are provided per chip.

At the time of dicing, the semiconductor wafer 20 is cut along the scribe areas 24 using a diamond cutter or using laser beams. Individual IC chips are obtained after such cutting. FIG. 3 shows an area (hereinafter to be referred to as a cut area) 25 in which the IC chips are actually cut by dicing.

Each pad 22 is disposed so that most of it (or entire) is superimposed on the cut area 25. Accordingly, as shown in FIG. 4B, most (or all) portion of each pad 22 is cut out by dicing. In other words, in the IC chip obtained after dicing, almost no portion of the pad is left that can be used for reading out secret information stored in the memory area or for corrupting the secret information.

In the first embodiment, the pads 22 and the wires 23 are formed on the same wired layer, although there is no special limit to this arrangement. In other words, as shown in FIG. 4A, an interlayer insulating film 27 may be laminated on a field oxide film 26 which is laminated on a semiconductor substrate (or a semiconductor area) 20. Then, a wired layer may be laminated on this. The pads 22 and the lead wires 23 are formed continuously on the wired layer. The wired layer is made of aluminum or copper, for example.

A method of manufacturing the semiconductor device according to the first embodiment will be explained next. At first, the field oxide film 26 is formed on the semiconductor substrate 20 to divide the wafer into the chip areas 21 and the scribe areas 24. The circuit elements like transistors are formed within the chip areas 21. Then, the interlayer insulating film 27 is laminated on the semiconductor substrate 20.

Contact holes (not shown) are formed at predetermined portions of the interlayer insulating film 27. The aluminum or copper wired layer is laminated on the semiconductor substrate 20. This wired layer is patterned to form the pads 22 and the lead wires 23. Thus, the chip areas 21 have been formed. A state obtained by the above process is shown in FIG. 4A.

The pads 22 are disposed in the scribe areas 24. The lead wires 23 are electrically connected to the circuit elements within the chip areas 21 through contact sections made of aluminum or copper filled in the contact holes.

Electric signals are supplied to the pads 22 from the outside to write data into the memory areas within the chip areas 21. Thereafter, the semiconductor substrate 20 is cut along the scribe areas 24 using a diamond cutter or using laser beams. When the semiconductor substrate 20 is cut, the cut areas 25 within the scribe areas 24 are cut out. Thus, individual IC chips are obtained. A state obtained by the above process is shown in FIG. 4B.

The IC chips obtained are packaged. Then, individual IC chips are mounted on cards having approximately a rectangular shape, thereby manufacturing the IC cards.

According to the first embodiment described above, the pads 22 are formed in the scribe areas 24. Data is written into the memory areas within the chip areas 21 by using the pads 22. The wafer is diced to cut the pads 22 together with the scribe areas 24. Accordingly, after the chip areas 21 have been cut and the IC chips are obtained, there remains almost no pad 22 or there remains no pad at all in the IC chips. Therefore, it is possible to prevent the written data from being read out from the memory areas of the IC chips and to prevent corruption of the written data.

Figure 5:
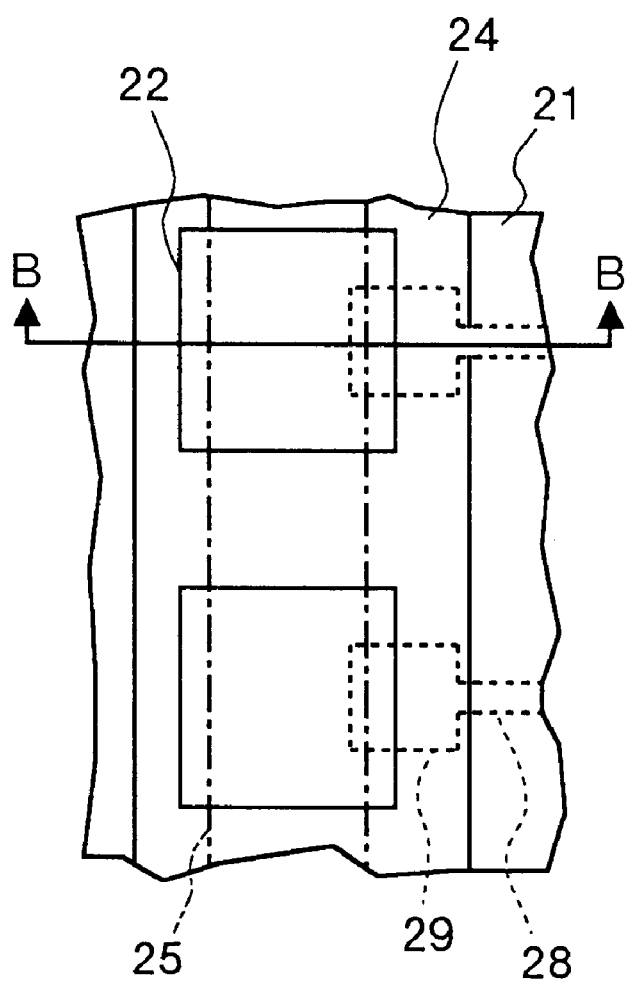
FIG. 5 is a top plan view schematically illustrating an enlarged part of a scribe area of a semiconductor wafer manufactured by a method of the second embodiment of the present invention.
Figure 6A:
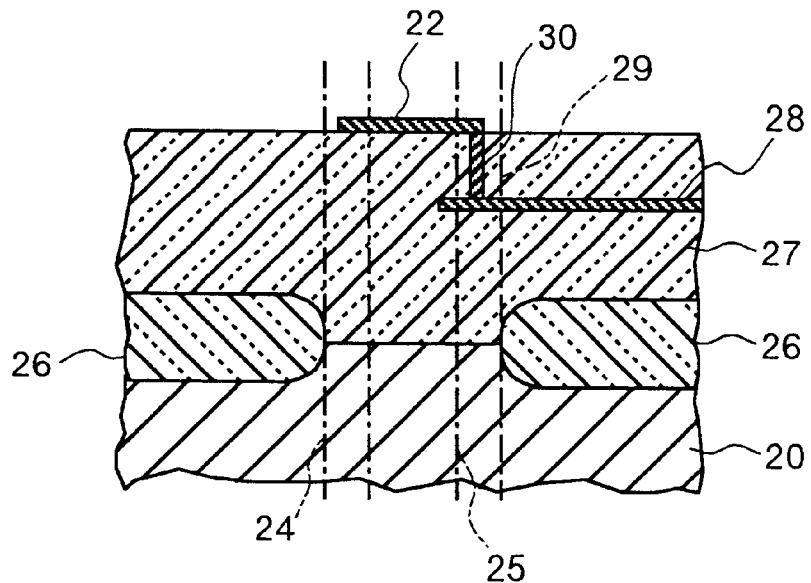
FIG. 6A and FIG. 6B are vertical cross-sectional views of a portion cut along a B—B line of the semiconductor wafer shown in FIG. 5.
Figure 6B:
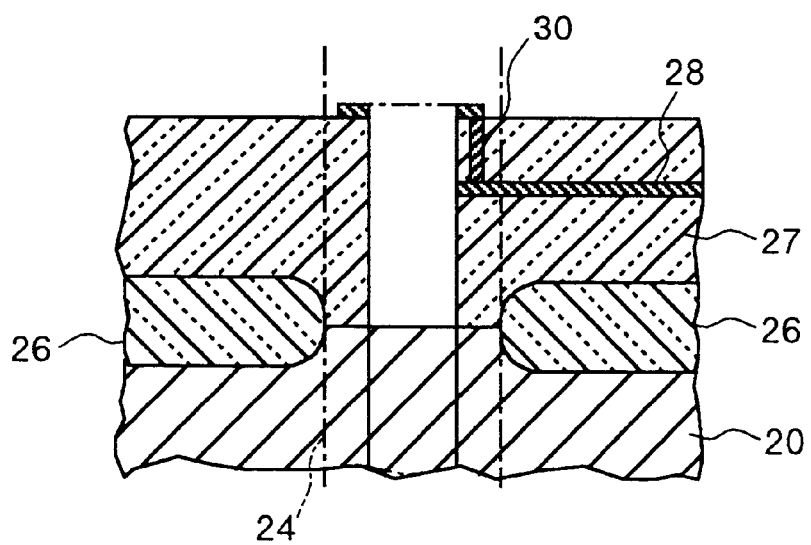

FIG. 5 is a top plan view schematically illustrating an enlarged part of a scribe area of a semiconductor wafer manufactured using a method of a second embodiment of the present invention. FIG. 6A and FIG. 6B are vertical cross-sectional views of a portion cut along a B—B line of the semiconductor wafer shown in FIG. 5. FIG. 6A shows a state before dicing, and FIG. 6B shows a state after dicing. Parts having structures identical to those of the first embodiment are attached with the same reference numerals, and their explanation will be omitted.

While the lead wires 23 and the pads 22 are formed on the same wired layer in the first embodiment, the second embodiment is different from the first embodiment in the following. That is, as shown in FIG. 5, FIG. 6A, and FIG. 6B, and contact pads 29 and lead wires 28 connected to the pads 29 are formed on a wired layer which is below the layer on which the pads 22 are formed.

The pads 22 are electrically connected to the pads 29 through contact sections 30 that pierce through an interlayer insulating film 27. The lead wires 28 are electrically connected to circuit elements of memory areas not shown. The lead wires 28 are made of tungsten, titanium, titanium nitride or copper.

A method of manufacturing the semiconductor device according to the second embodiment is different from that of the first embodiment in that a multi-layer wiring technique is used to form wires. However, as the wiring using the multi-layer wiring technique is not a gist of the present invention, this will not be explained here.

According to the second embodiment, the data-writing pads 22 are cut at the time of dicing in a similar manner to that of the first embodiment. Accordingly, after the chip areas 21 have been cut and the IC chips are obtained, there remains almost no pad 22 or there remains no pad at all in the IC chips. Therefore, it is possible to prevent the write data from being read out from the memory areas of the IC chips and to prevent corruption of the written data.

Figure 7A:
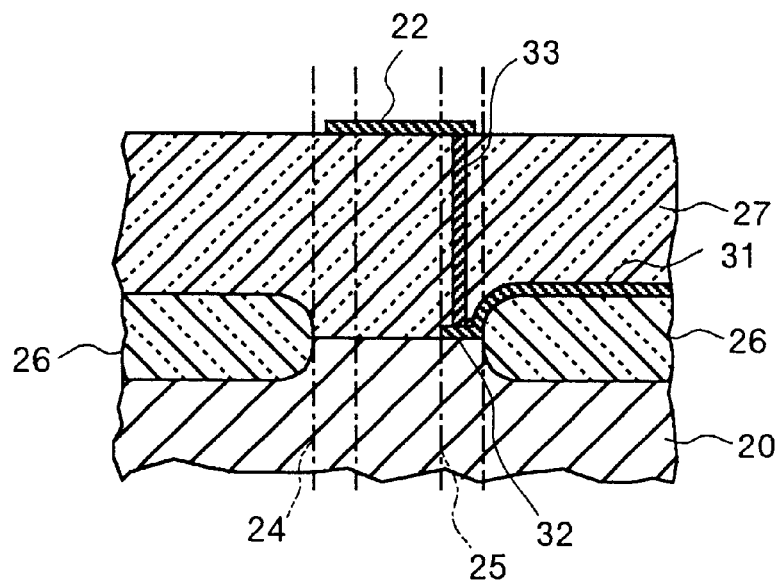
FIG. 7A and FIG. 7B are vertical cross-sectional views illustrating a semiconductor wafer manufactured by a modification of the method of the second embodiment.
Figure 7B:
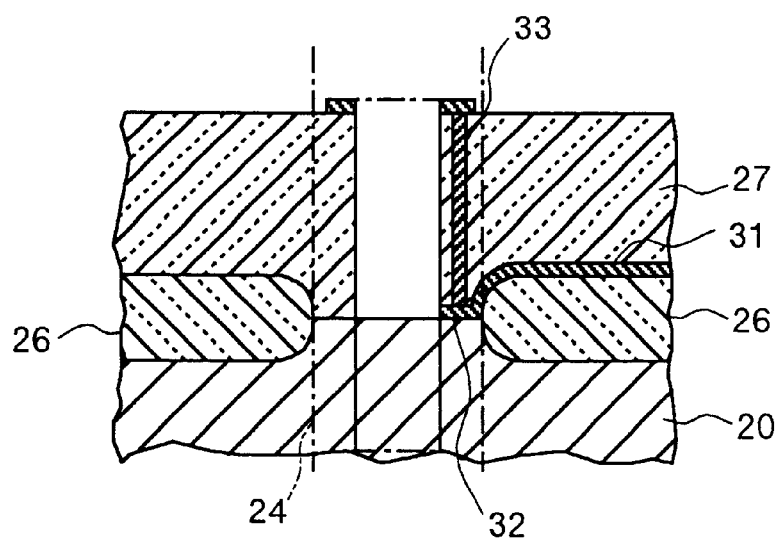

In the above-described second embodiment, the lead wires 28 are formed on the wired layer of titanium nitride or copper. However, the structure is not limited to this. For example, it is also possible to have such a structure that lead wires 31 and contact pads 32 are continuously formed on a gate-wired layer as shown in FIG. 7A and FIG. 7B. FIG. 7A shows a state before dicing, and FIG. 7B shows a state after dicing.

In this case, each pad 32 and each data-writing pad 22 are electrically connected with each other through a contact section 33 that pierces through an interlayer insulating film 27. The lead wires 31 are constructed of polysilicon, or by two layers of tungsten and polysilicon, or by tungsten.

Figure 8A:
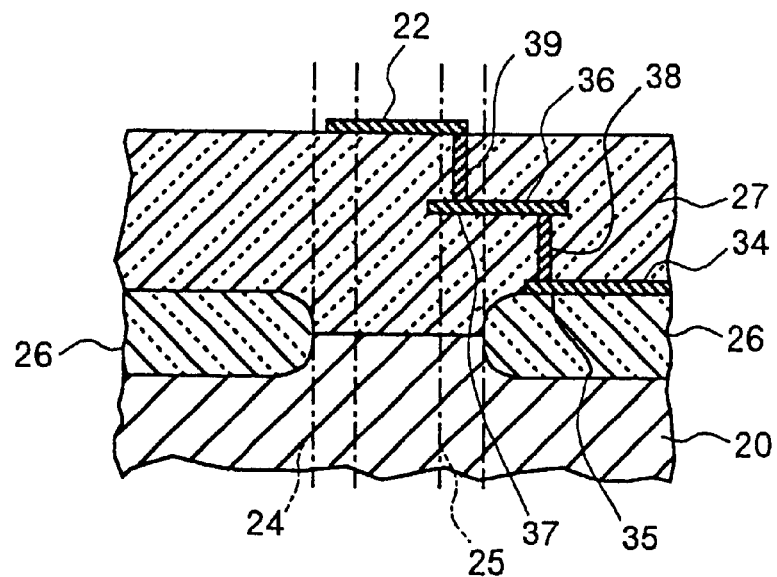
FIG. 8A and FIG. 8B are vertical cross-sectional views illustrating a semiconductor wafer manufactured by another modification of the method of the second embodiment.
Figure 8B:
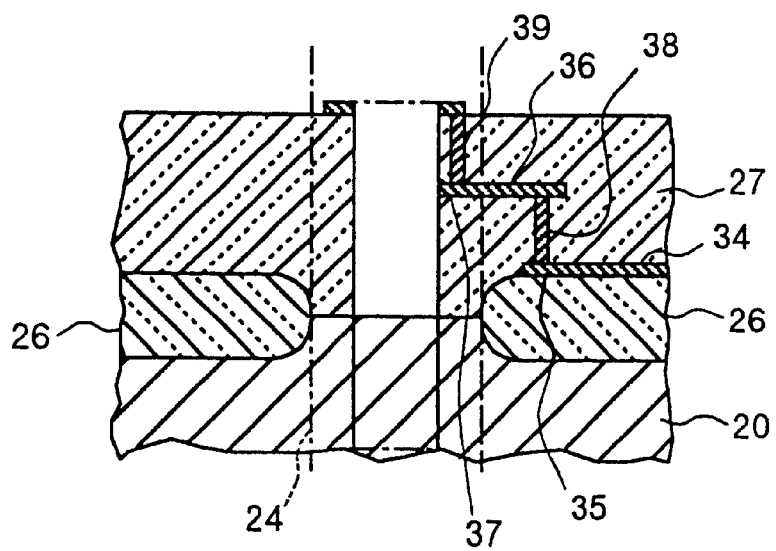

Alternatively, lead wires 34 and 36 may be structured in a plurality of divided wired layers, as shown in FIG. 8A and FIG. 8B, for example. The lead wires 34 and contact pads 35 are formed continuously on a gate-wired layer made of polysilicon, for example. The lead wires 36 and contact pads 37 are continuously formed on a titanium nitride wired layer of an upper layer, for example. FIG. 8A shows a state before dicing, and FIG. 8B shows a state after dicing.

In this case, each pad 35 and each upper-layer lead wire 36 are electrically connected with each other through a contact section 38 that pierces through the interlayer insulating film 27. Further, each pad 37 and each data-writing pad 22 are electrically connected with each other through a contact section 39 that pierces through the interlayer insulating film 27. When the lead wires 34 and 36 are structured to extend over a plurality of wired layers as shown in FIG. 8, there is an advantage that it is difficult to understand the wired routes of the lead wires 34 and 36 when the IC chips are observed from the above.

FIG. 9A, FIG. 9B, FIG. 10A, and FIG. 10B are vertical cross-sectional views of main portions of a semiconductor device illustrated in the order of manufacturing the device based on a manufacturing method relating to a third embodiment of the present invention.

According to the third embodiment, in FIG. 3, FIG. 4A, and FIG. 4B of the first embodiment, for example, data is written into the memory areas within the chip areas 21, then the pads 22 are removed, and the wafer is diced thereafter. Parts having the structures identical to those of the first embodiment are attached with the same reference numerals, and their explanation will be omitted.

Figure 9A:
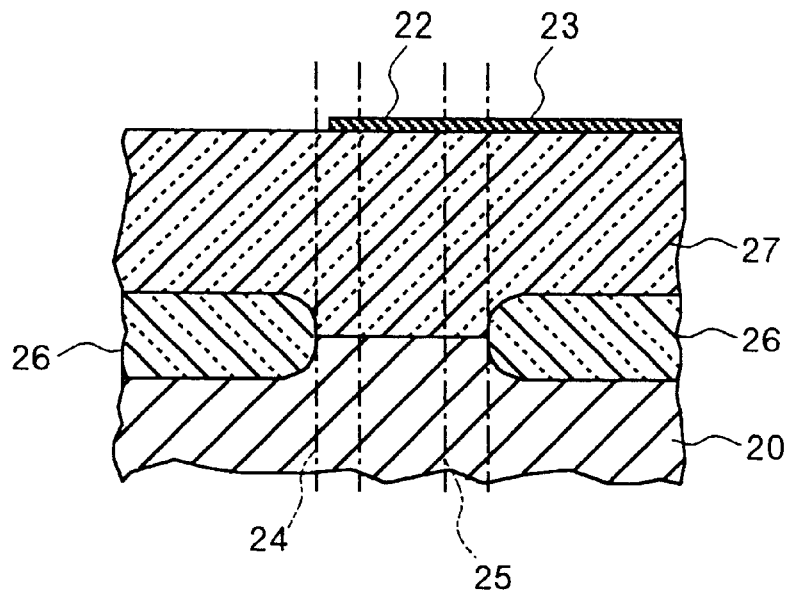
FIG. 9A and FIG. 9B are vertical cross-sectional views of main portions of a semiconductor device illustrated in the order of manufacturing the device based on a manufacturing method relating to a third embodiment of the present invention.

At first, chip areas 21, scribe areas 24, pads 22 and lead wires 23 are formed on a semiconductor substrate 20 (refer to FIG. 9A). Data is written into memory areas not shown within the chip areas 21 through the pads 22. Then, a resist is coated onto the semiconductor substrate 20. Thereafter, light beams are irradiated onto the substrate after forming a mask.

Figure 9B:
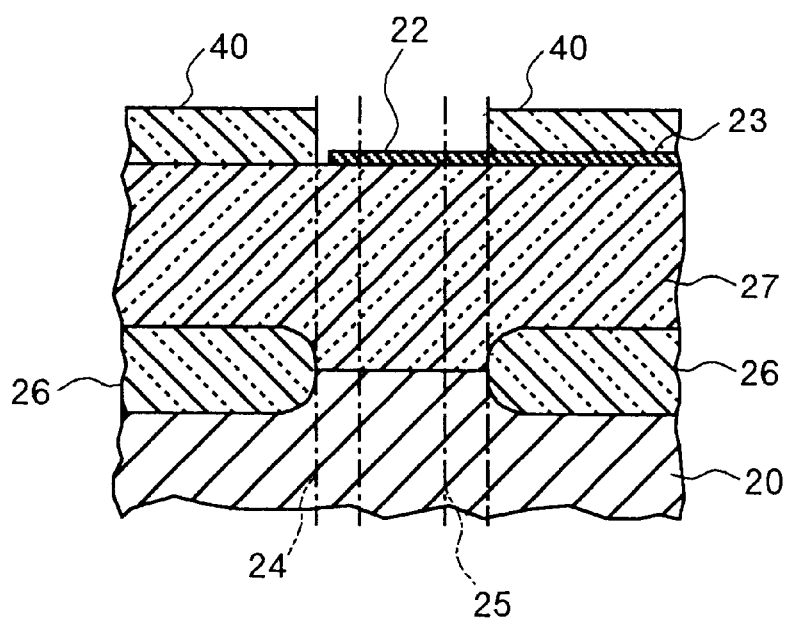
Figure 10A:
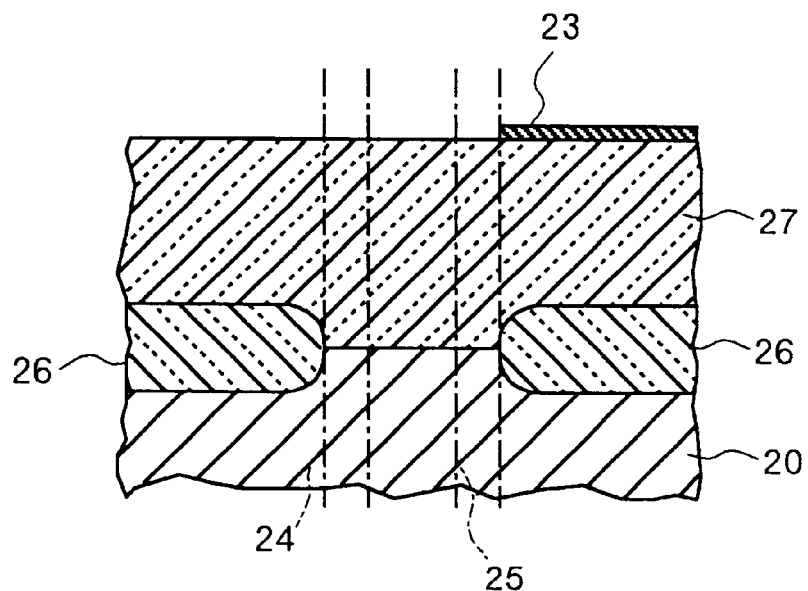
FIG. 10A and FIG. 10B are vertical cross-sectional views of main portions of a semiconductor device illustrated in the order of manufacturing the device based on a manufacturing method relating to the third embodiment of the present invention.
Figure 10B:
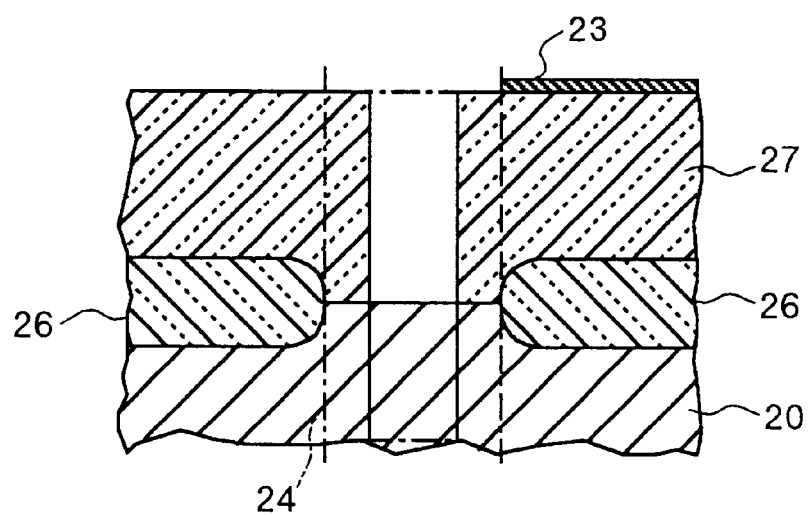

Subsequently, the irradiated surface is developed to expose the scribe areas 24 (refer to FIG. 9B). The surface is then etched utilizing the remaining resist 40 as a mask, thereby removing the pads 22 on the scribe areas 24 (refer to FIG. 10A). Thereafter, the wafer is cut to obtain the IC chips (refer to FIG. 10B).

According to the third embodiment, the pads 22 are removed before dicing. Therefore, it is possible to prevent a part of the pad 22 from remaining in the IC chips after dicing when the width of the cut area 25 is smaller than the width of each pad 22. Therefore, after the wafer has been cut and the IC chips are obtained, it is possible to prevent the written data from being read out from the memory areas of the IC chips and to prevent corruption of the written data.

Figure 11:
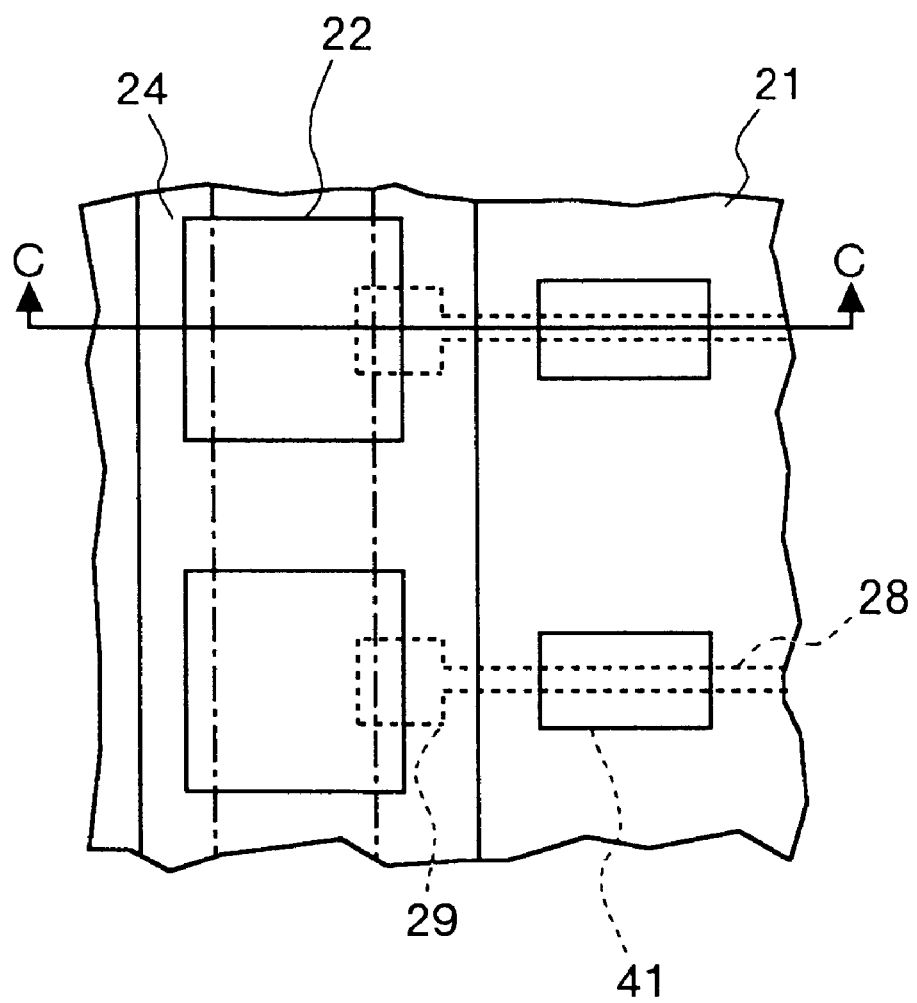
FIG. 11 is a top plan view schematically illustrating an enlarged part of a semiconductor wafer manufactured by a method of the fourth embodiment of the present invention.
Figure 12A:
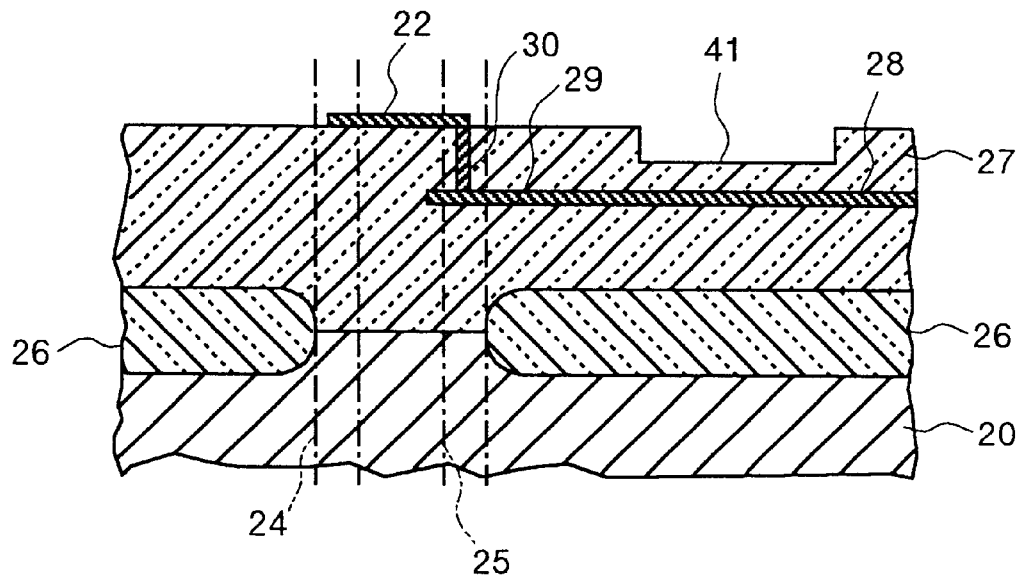
FIG. 12A and FIG. 12B are vertical cross-sectional views of a portion cut along a C—C line of the semiconductor wafer shown in FIG. 11.
Figure 12B:
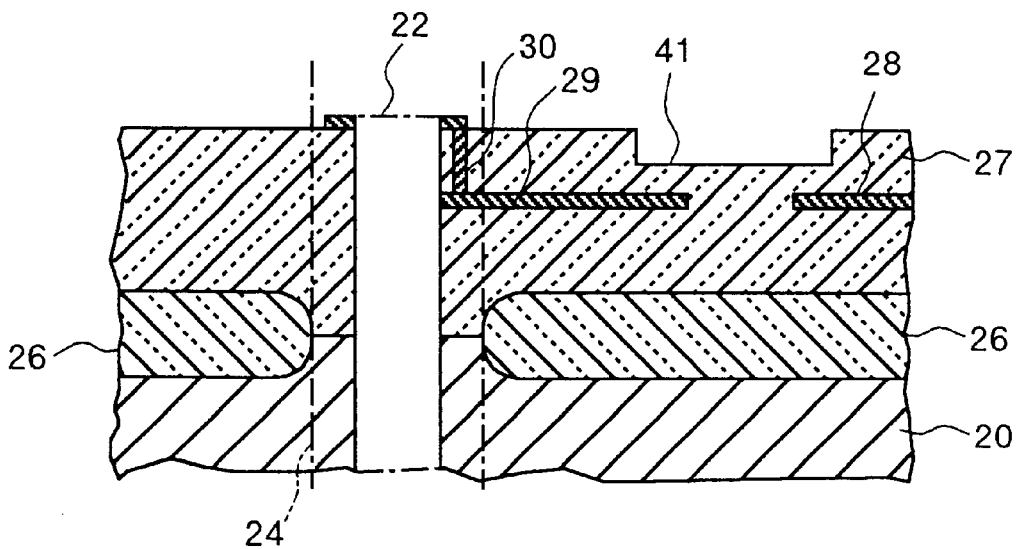

FIG. 11 is a top plan view schematically illustrating an enlarged part of a scribe area of a semiconductor wafer manufactured by a method of a fourth embodiment of the present invention. FIG. 12A and FIG. 12B are vertical cross-sectional views of a portion cut along a C—C line of the semiconductor wafer shown in FIG. 11. FIG. 12A shows a state before dicing, and FIG. 12B shows a state after dicing.

According to the fourth embodiment, in FIG. 5, FIG. 6A, and FIG. 6B of the second embodiment, for example, data is written into the memory areas not shown within the chip areas 21, then the lead wires 28 are cut, and the wafer is diced thereafter. Parts having the structures identical to those of the second embodiment are attached with the same reference numerals, and their explanation will be omitted.

At first, chip areas 21, scribe areas 24, data-writing pads 22, lead wires 28, contact pads 29, and contact sections 30 are formed on a semiconductor substrate 20. Further, fuse windows 41 are formed on the lead wires 28, based on a photolithographic technique or by etching, for example (refer to FIG. 11 and FIG. 12A).

Then, data is written into memory areas not shown within the chip areas 21 through the pads 22 Thereafter, laser beams are irradiated onto the fuse windows 41, thereby cutting the lead wires 28. Then, the wafer is diced to obtain IC chips (refer to FIG. 12B).

According to the fourth embodiment, the lead wires 28 are removed before dicing. Therefore, even if a part of the pad 22 remains in the IC chip after dicing, it is possible to isolate this pad from the inside memory area when the width of the cut area 25 is smaller than the width of each pad 22. Therefore, after the wafer has been cut and the IC chips are obtained, it is possible to prevent the written data from being read out from the memory areas of the IC chips and to prevent corruption of the written data.

Figure 13:
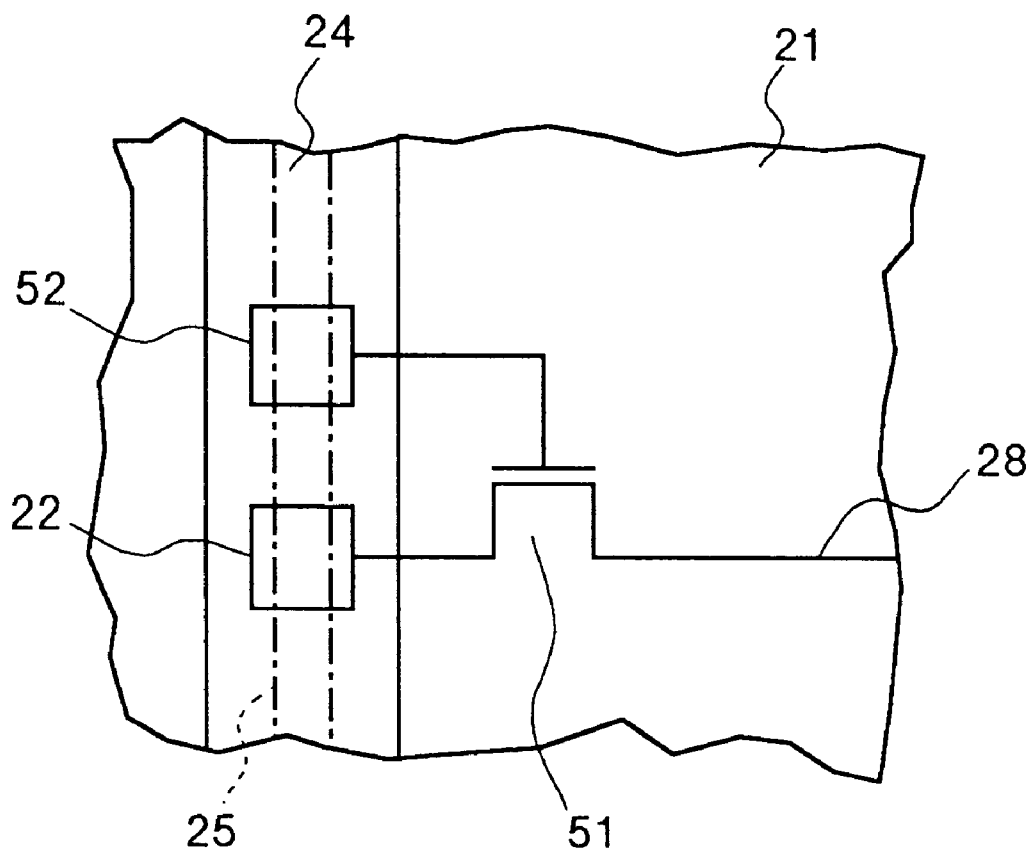
FIG. 13 is a top plan view schematically illustrating a modification of the method of the fourth embodiment.

As a method of cutting the lead wires 28, it may be so arranged that a MOS transistor 51 is provided in advance in the middle of each lead wire 28 within the chip area 21, as shown in FIG. 13, and this transistor 51 is destroyed before dicing. A source and a drain of the MOS transistor 51 are connected to the data-writing pad 22 and the inside memory area respectively. Further, inside the scribe area 24, there is formed a pad 52 for supplying a gate signal to the MOS transistor 51.

At the time of writing data into each memory area, a suitable gate signal is supplied from the outside to turn on the MOS transistor 51. After the data writing has been completed, a high voltage is applied to the pad 52, thereby destroying the transistor 51. When each transistor 51 has been destroyed, the lead wire 28 is cut. Thereafter, dicing is carried out.

Figure 14:
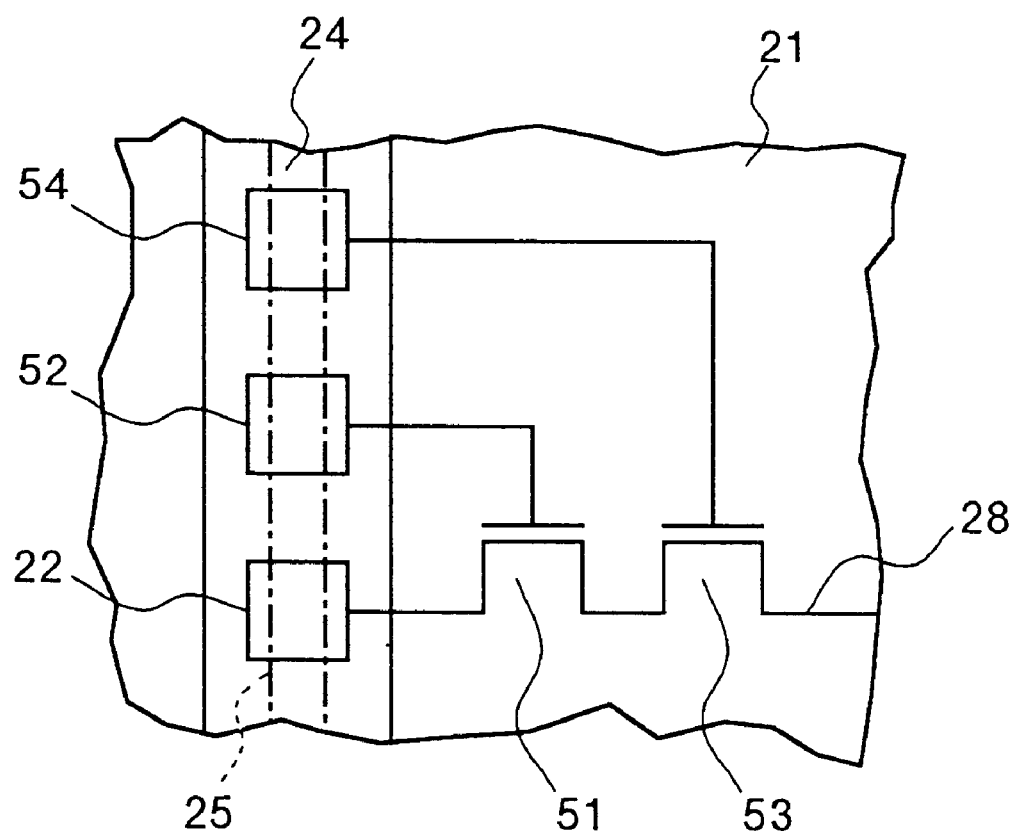
FIG. 14 is a top plan view schematically illustrating another modification of the method of the fourth embodiment.

Further, as shown in FIG. 14, another MOS transistor 53 may be formed between the MOS transistor 51 and the memory area, and the two MOS transistors 51 and 53 are connected in series. In this case, inside the scribe area 24, there is additionally formed a pad 54 for supplying a gate signal to the MOS transistor 53.

At the time of writing data into each memory area, suitable gate signals are supplied from the outside to the two MOS transistors 51 and 53 respectively to turn on the two MOS transistors 51 and 53. After the data writing has been completed, the transistor 53 at the memory area side is turned off, and then the other transistor 51 is destroyed.

With the above-described arrangement, it is possible to prevent the memory areas from being affected by the destruction of the transistors 51. When all the transistors 51 have been destroyed, the lead wires 28 are cut. The wafer is diced thereafter.

Figure 15:
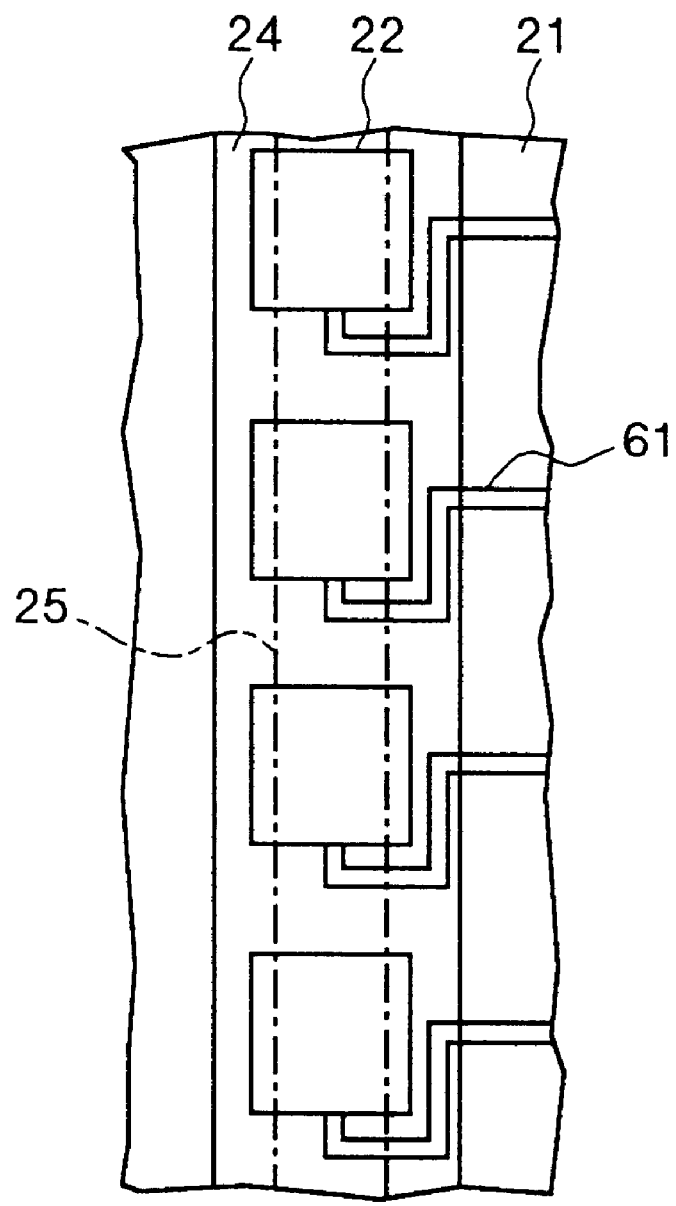
FIG. 15 is a top plan view schematically illustrating an enlarged part of a scribe area of a semiconductor wafer manufactured by a method of the fifth embodiment of the present invention.

FIG. 15 is a top plan view schematically illustrating an enlarged part of a scribe area of a semiconductor wafer manufactured by a method of a fifth embodiment of the present invention. Parts having the structures identical to those of the other embodiments are attached with the same reference numerals, and their explanation will be omitted.

In the fifth embodiment, each lead wire 61 for electrically connecting each pad 22 with each memory area not shown within each chip area 21 is extended to surround the pad 22 by one quarter of the whole surrounding including one corner of the pad 22, and is connected to the pad 22 within the cut area 25. With this arrangement, the lead wire 61 is separated from the pad 22 at a connection portion.

According to the fifth embodiment, the lead wire 61 is cut in the middle by dicing. Therefore, even if a part of the pad 22 remains in the IC chip after dicing, it is possible to isolate this pad from the memory area. Accordingly, after the wafer has been cut and the IC chips are obtained, it is possible to prevent the written data from being read out from the memory areas of the IC chips and to prevent corruption of the written data.

Figure 16:
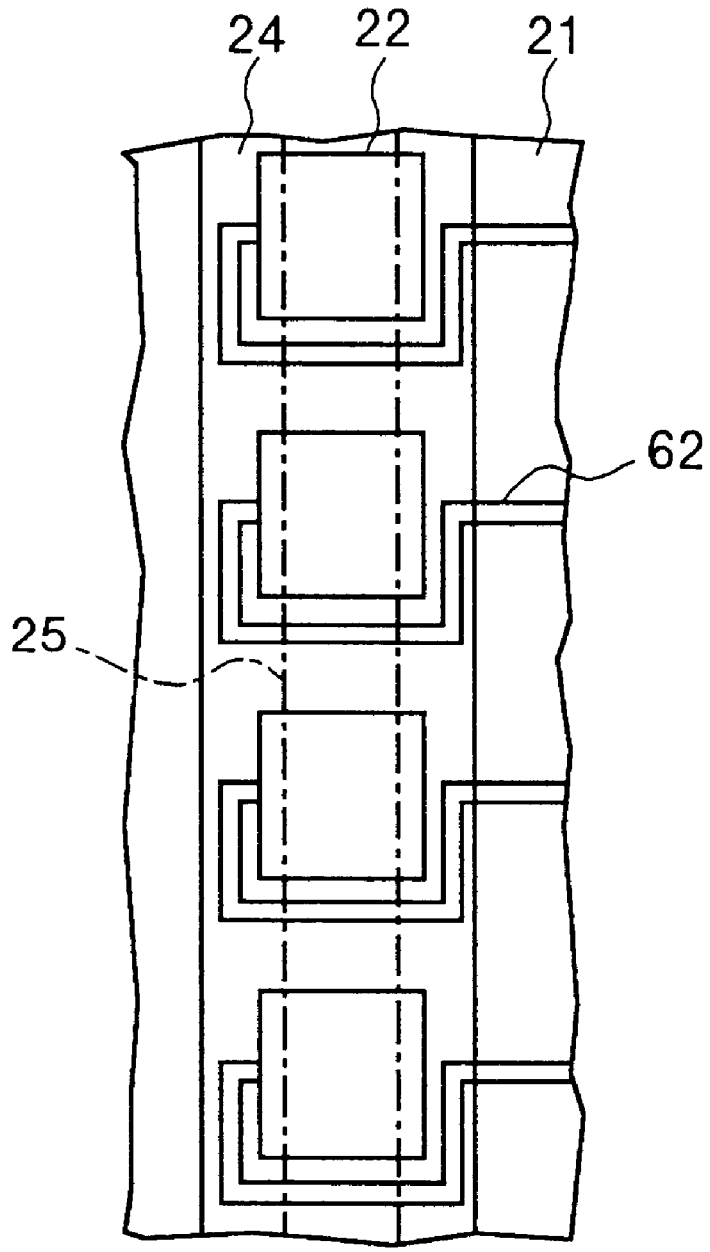
FIG. 16 is a top plan view schematically illustrating a modification of the method of the fifth embodiment.

Further, in place of the lead wire 61, a lead wire 62 is extended to surround a pad 22 by one half of the whole surrounding across area 25, as shown in FIG. 16. Alternatively, as shown in FIG. 17, lead wires 63, 64 and 65 are extended in a length larger than the size of the pad 22 and turned within a scribe area 24 to exceed the cut area 25.

Figure 17:
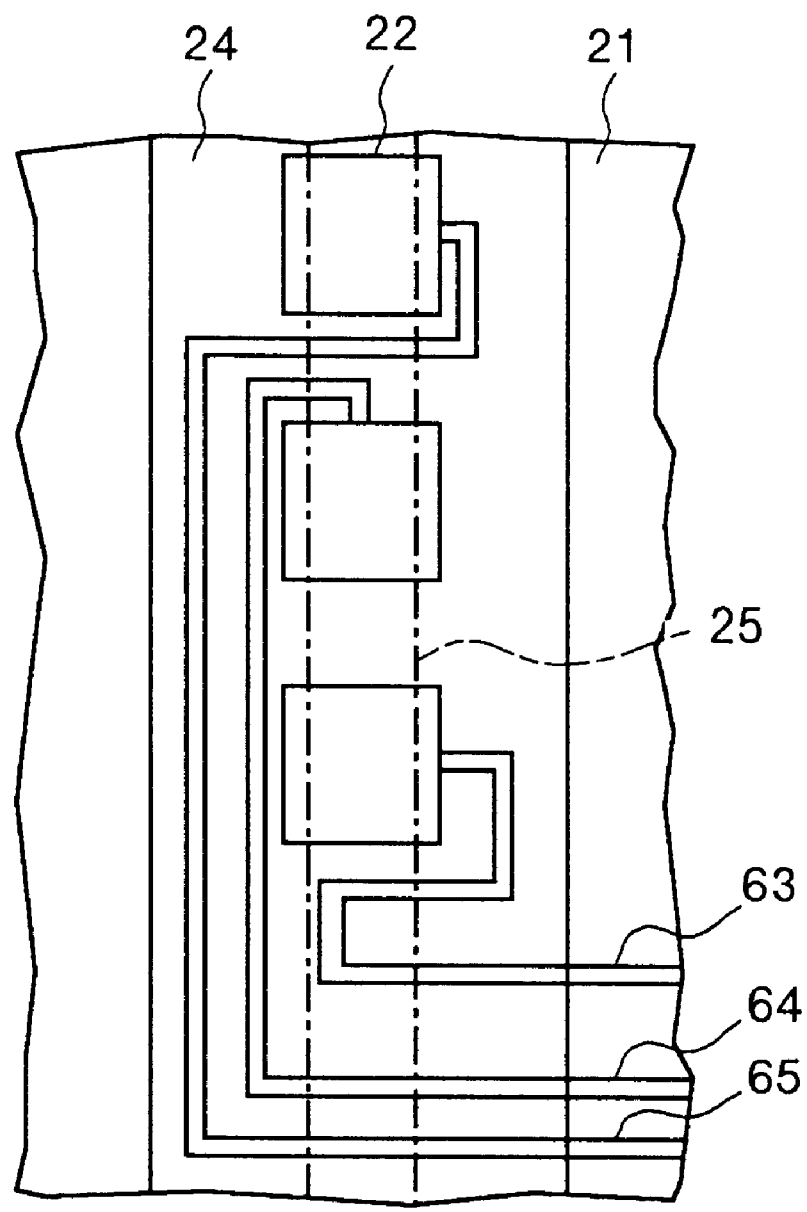
FIG. 17 is a top plan view schematically illustrating another modification of the method of the fifth embodiment.

When the lead wires are arranged as shown in FIG. 16 or FIG. 17, a part of the lead wires 62, 63, 64 and 65 respectively is cut at the time of dicing. Therefore, it is possible to securely isolate the lead wires 62, 63, 64 and 65 from the pads 22 respectively. Accordingly, even if a part of the pad 22 remains in the IC chip after dicing, it is possible to isolate this pad from the memory area.

Figure 18:
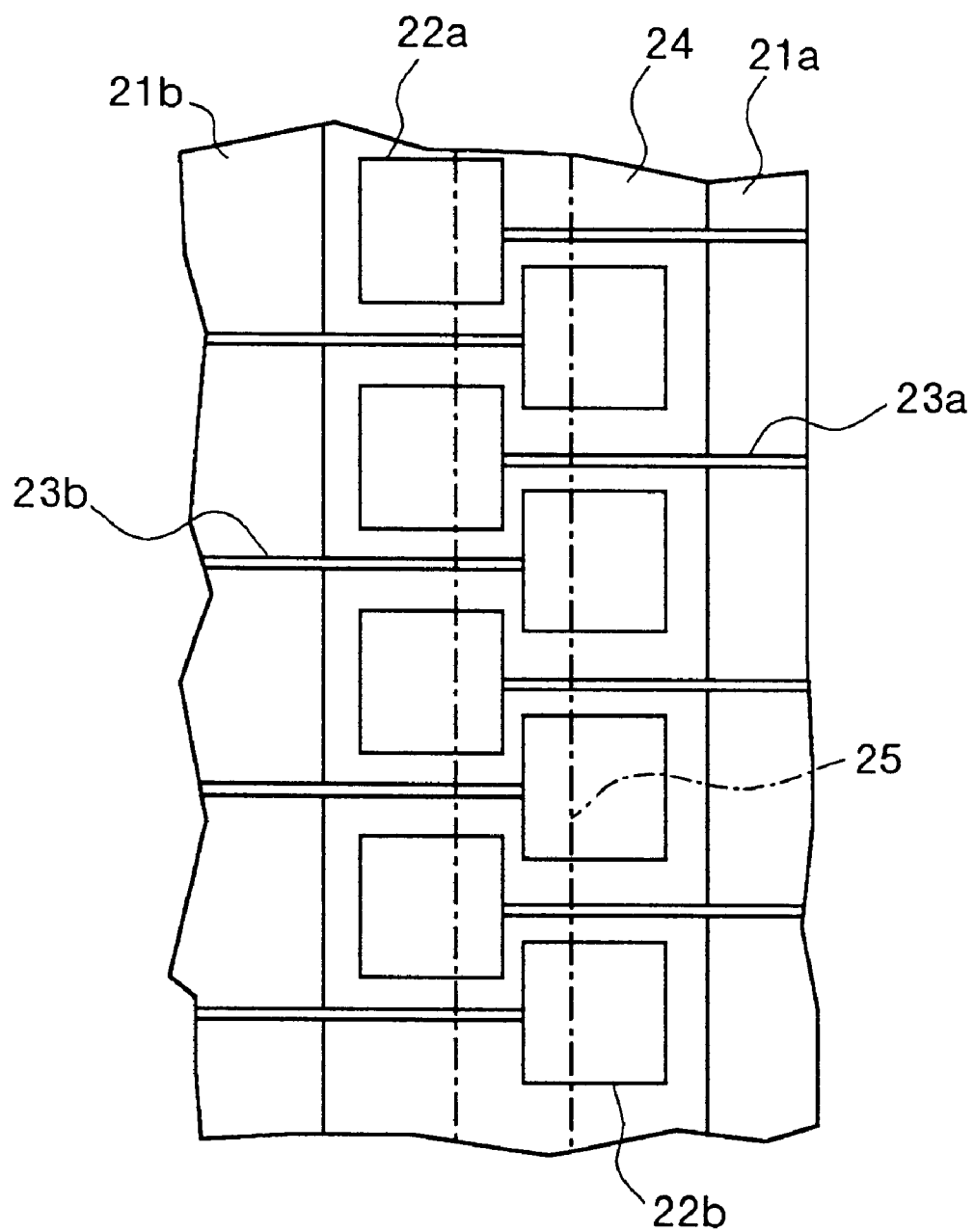
FIG. 18 is a top plan view schematically illustrating an enlarged part of a scribe area of a semiconductor wafer manufactured by a method of the sixth embodiment of the present invention.

FIG. 18 is a top plan view schematically illustrating an enlarged part of a scribe area of a semiconductor wafer manufactured by a method of a sixth embodiment of the present invention. Parts having the structures identical to those of the other embodiments are attached with the same reference numerals, and their explanation will be omitted.

In the sixth embodiment, pads 22a and 22b of adjacent chip areas 21a and 21b respectively are disposed within a scribe area 24 of both chip areas 21a and 21b.

The pad 22a of one chip area 21a is disposed closer to the other chip area 21b. Similarly, the pad 22b of the other chip area 21b is disposed closer to the other chip area 21a. The pads 22a and 22b are connected to memory areas within the respective chip areas 21a and 21b through lead wires 23a and 23b respectively.

According to the sixth embodiment, the pads 22a and 22b of the chip areas 21a and 21b are formed to extend over the cut area 25. Therefore, even if a part of the respective pads 22a and 22b remains in the IC chip after dicing, it is possible to isolate these pads from the respective memory areas as the respective pads were originally formed on the other IC chip. Accordingly, it is possible to prevent the write data from being read out from the memory areas of the IC chips and to prevent corruption of the written data.

Figure 19:
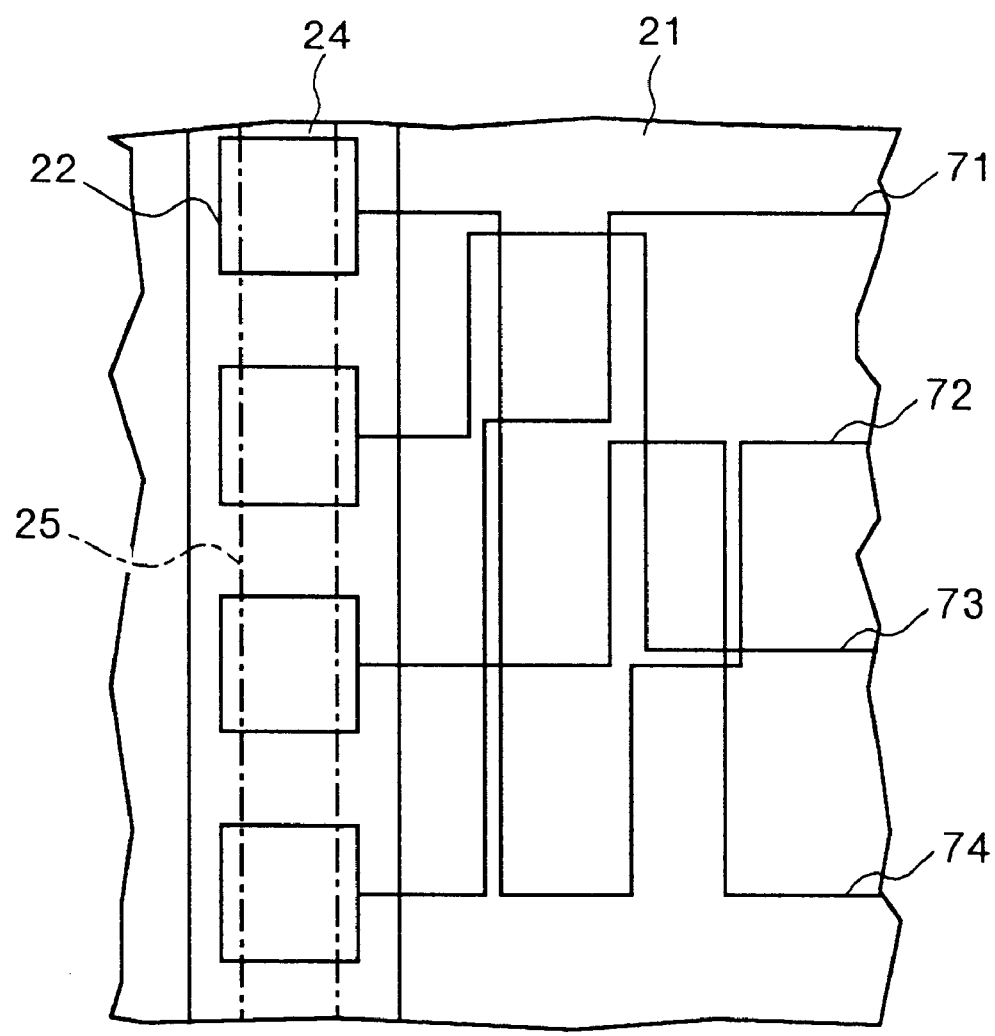
FIG. 19 is a top plan view schematically illustrating an enlarged part of a semiconductor wafer manufactured by a method of the seventh embodiment of the present invention.

FIG. 19 is a top plan view schematically illustrating an enlarged part of a semiconductor wafer manufactured by a method of a seventh embodiment of the present invention. Parts having the structures identical to those of the other embodiments are attached with the same reference numerals, and their explanation will be omitted.

In the seventh embodiment, lead wires 71, 72, 73 and 74 for connecting pads 22 formed within a scribe area 24 to memory areas not shown within a chip area 21 are wired in a mutually insulated but complex and cris-crossed manner through a plurality of wired layers. The lead wires 71, 72, 73 and 74 that appear to be crossing when the chip area 21 is observed from the above are not actually in contact with each other as the lead wires 71, 72, 73 and 74 are formed on different levels of wired layers.

According to the seventh embodiment, it is difficult to understand the wired routes of the lead wires 71, 72, 73 and 74 when the IC chip after dicing is observed from the above. Therefore, even if a part of the pad 22 remains after dicing, it is difficult to know which one of the pads is to be used to read the write data from the memory area within the IC chip. Accordingly, it is possible to prevent the written data from being read out from the memory areas of the IC chips and to prevent corruption of the written data from being.

Figure 20:
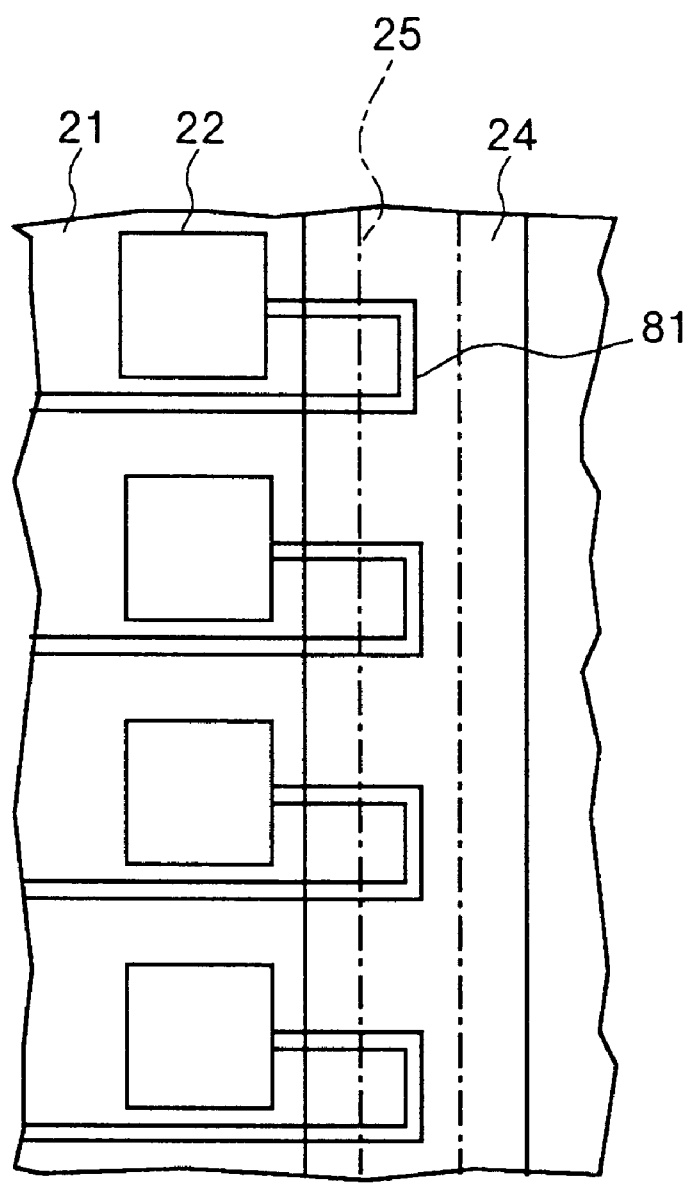
FIG. 20 is a top plan view schematically illustrating an enlarged part of a scribe area of a semiconductor wafer manufactured by a method of the eighth embodiment of the present invention.

FIG. 20 is a top plan view schematically illustrating an enlarged part of a scribe area of a semiconductor wafer manufactured by a method of an eighth embodiment of the present invention. Parts having the structures identical to those of the other embodiments are attached with the same reference numerals, and their explanation will be omitted.

In the eighth embodiment, each pad 22 is formed within a chip area 21. A lead wire 81 electrically connected to a memory area not shown within the chip area 21 is extended to within a scribe area 24. The lead wire 81 is returned within the cut area 25 and is electrically connected to the pad 22 within the original chip area 21. In other words, in the eighth embodiment, the lead wire 81 is patterned to pass through the cut area 25. A part of the lead wire 81 is completely cut when the wafer is cut in the cut area 25 at the time of dicing.

The pad 22 and the lead wire 81 may be formed on the same wired layer or on different wired layers, and they may be mutually electrically connected through a contact section. Alternatively, the lead wire 81 may extend over the cut area 25 and may be returned at an external portion of the cut area 25 within the scribe area 24.

According to the eighth embodiment, as the lead wire 81 is cut in the middle at the time of dicing, it is possible to isolate the pad 22 from the memory area after dicing. Therefore, after the wafer has been cut and the IC chips are obtained, it is possible to prevent the written data from being read out from the memory areas of the IC chips and to prevent corruption of the written data.

Figure 21:
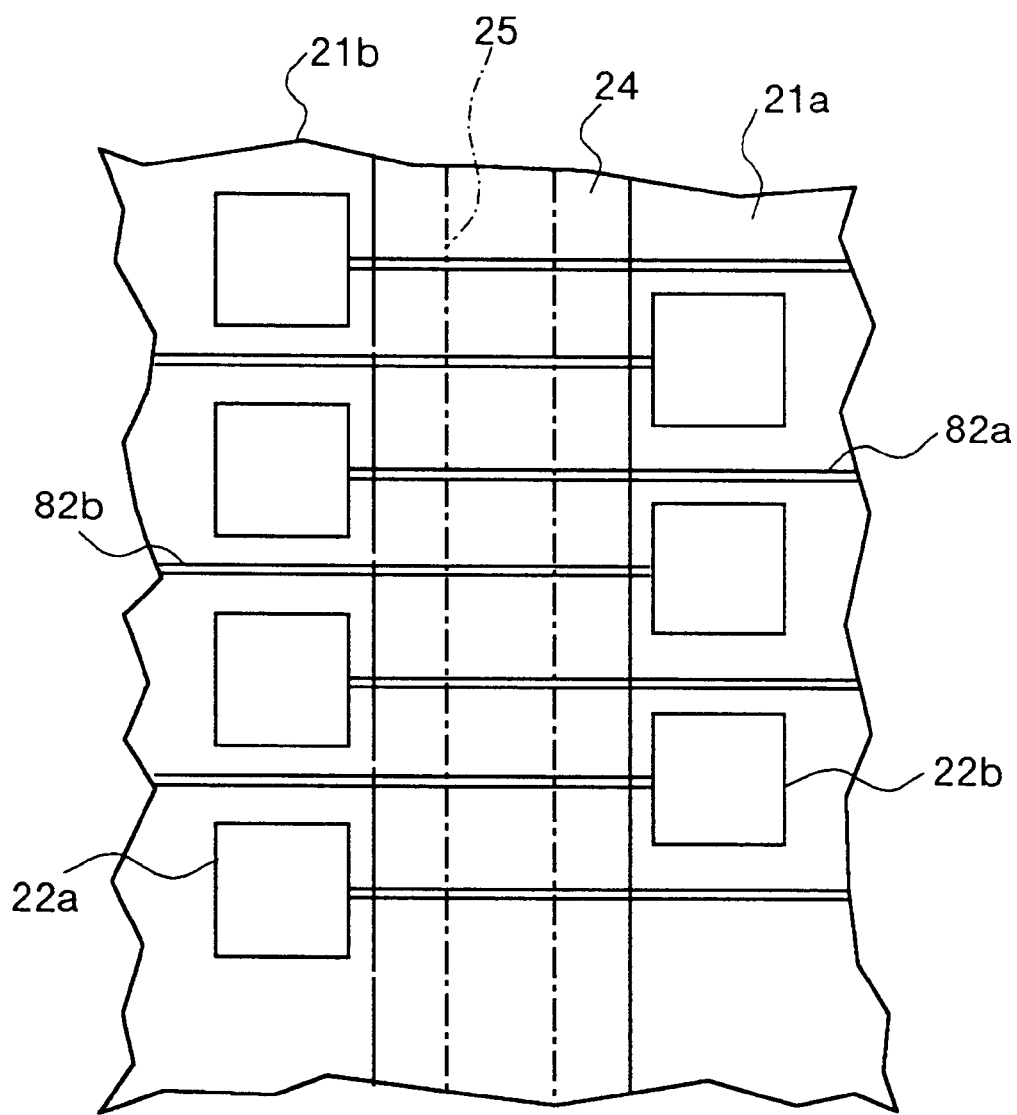
FIG. 21 is a top plan view schematically illustrating an enlarged part of a scribe area of a semiconductor wafer manufactured by a method of the ninth embodiment of the present invention.

FIG. 21 is a top plan view schematically illustrating an enlarged part of a scribe area of a semiconductor wafer manufactured by a method of a ninth embodiment of the present invention. Parts having the structures identical to those of the other embodiments are attached with the same reference numerals, and their explanation will be omitted.

In the ninth embodiment, a lead wire connected to a memory area not shown within one chip area is extended over the cut area within a scribe area, and is electrically connected to a pad formed in another chip area. In the example shown in FIG. 21, in the adjacent chip areas 21a, 21b, a pad 22a for writing data into a memory area not shown within one chip area 21a is formed within the other adjacent chip area 21b.

Then, a lead wire 82a extended from within one chip area 21a crosses the cut area 25 and is electrically connected to the pad 22a. Similarly, a lead wire 82b extended from within the other chip area 21b crosses the cut area 25 and is electrically connected to the pad 22b. The two chip areas for forming pads are not limited to the adjacent chip areas.

According to the ninth embodiment, even if the pads 22a and 22b remain in the IC chip after dicing, these pads were originally formed in other IC chip. Therefore, it is possible to isolate these pads from the memory areas. Accordingly, after the wafer has been cut and the IC chips are obtained, it is possible to prevent the written data from being read out from the memory areas of the IC chips and to prevent corruption of the written data.

According to the present invention, pads for writing data into memory areas within chip areas are formed within the scribe areas. After the data has been written into the memory areas within the chip areas, the pads are cut together with the scribe areas when the wafer is diced. Therefore, after the wafer has been cut and the semiconductor chips are obtained, it is possible to prevent the written data from being read out from the memory areas of the semiconductor chips and to prevent corruption of the written data. Further, since the pads are formed in the scribe areas, it is possible to manufacture the chips in small sizes, which leads to a cost reduction.

Further, according to the next invention, lead wires connected to pads are drawn out into the scribe areas. The lead wires are separated from the pads within the scribe areas, and parts of the wires are cut together with the scribe areas. Therefore, the lead wires are isolated from the pads, and they are electrically insulated. Accordingly, after the wafer has been cut and individual semiconductor chips are obtained, it is possible to prevent the written data from being read out from the memory areas of the semiconductor chips and to prevent corruption of the written data.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising the steps of:
   forming a plurality of chip areas having scribe areas in between on a semiconductor wafer;
   forming pads used for writing data into memory areas in respective chip areas in the scribe area;
   forming lead wires which connect the pads with the respective memory area;
   writing data into the memory areas through the pads; and
   cutting the semiconductor wafer along the scribe area after the data has been written thereby separating the chip areas and obtain semiconductor chips.

2. A method of manufacturing a semiconductor device according to claim 1, wherein before separating the chip areas to obtain the semiconductor chips, the chip areas are covered with a resist, the scribe areas are exposed, and the pads formed in the scribe areas are removed by etching.

3. A method of manufacturing a semiconductor device according to claim 1, wherein before separating the chip areas to obtain the semiconductor chips, the lead wires within the chip areas are cut.

4. A method of manufacturing a semiconductor device according to claim 1 further comprising the steps of:
   forming a field-effect transistor in the way of the lead wire within each chip area; and
   forming pads used for applying a gate voltage to the field-effect transistors in the scribe area,
       wherein the field-effect transistor is turned on at the time of writing data into the memory area, and
       the field-effect transistors are destroyed before separating the chip areas to obtain the semiconductor chips.

5. A method of manufacturing a semiconductor device according to claim 4 further comprising the steps of:
   forming a second field-effect transistor in between the field-effect transistor and respective memory area; and
   forming a pad used for applying a gate voltage to the second field-effect transistor in the scribe area,
       wherein the two field-effect transistors are turned on at the time of writing data in each memory area, and
       all the second field-effect transistors are turned off and then all the first field-effect transistors are destroyed before separating the chip areas to obtain the semiconductor chips.

6. A method of manufacturing a semiconductor device according to claim 1, wherein each lead wire within the scribe area is connected to each pad within a cut area wherein said cut area is the portion where the semiconductor wafer is actually cut, or each lead wire within each scribe area is connected to each pad beyond the cut area.

7. A method of manufacturing a semiconductor device according to claim 1, wherein within a scribe area sandwiched by two adjacent chip areas of a first chip area and second chip area, the pad in the first chip area is formed closer to the second chip area than to a cut area wherein said cut area is the portion where the semiconductor wafer is actually cut, and the pad in the second chip area is formed closer to the first chip area than to the cut area.

8. A method of manufacturing a semiconductor device according to claim 1, wherein a plurality of the pads are formed in each chip area, and the lead wires of the pads are disposed in a mutually insulated state through a plurality of wired layers in mutually crossed routes when observed from the above.

9. A method of manufacturing a semiconductor device, the method comprising the steps of:
   forming a plurality of chip areas having scribe areas in between on a semiconductor wafer;
   forming pads used for writing data into memory areas within respective chip areas;
   providing lead wires that connect the pads from within the chip areas into the scribe areas in such a way that the lead wires are disconnected from the pads due to cutting along the scribe area;
   writing data into the memory areas through the pads; and
   cutting the semiconductor wafer along the scribe areas after the data has been written thereby separating the chip areas and obtain semiconductor chips.

10. A method of manufacturing a semiconductor device according to claim 9, wherein each lead wire within the scribe area is returned to a cut area wherein said cut area is the portion where the semiconductor wafer is actually cut, and the lead wire is connected to the pad within the chip area.

11. A method of manufacturing a semiconductor device according to claim 9, wherein the lead wire is connected to a pad formed in other chip area beyond the scribe area.

* * * * *